(12) United States Patent
Jian et al.

(10) Patent No.: US 9,691,439 B2
(45) Date of Patent: Jun. 27, 2017

(54) CIRCUIT STRUCTURE FOR SUPPRESSING ELECTROMAGNETIC INTERFERENCE OF DDR SDRAM SIGNALS

(71) Applicant: MStar Semiconductor, Inc., Hsinchu Hsien (TW)

(72) Inventors: Yuan-De Jian, Hsinchu Hsien (TW); Ting-Kuang Wang, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 15/083,448

(22) Filed: Mar. 29, 2016

(65) Prior Publication Data

US 2016/0293245 A1 Oct. 6, 2016

(30) Foreign Application Priority Data

Mar. 31, 2015 (TW) .............................. 104110472 A

(51) Int. Cl.

| | |
|---|---|
| *G11C 7/02* | (2006.01) |
| *G11C 5/06* | (2006.01) |
| *G11C 5/14* | (2006.01) |
| *G11C 7/10* | (2006.01) |
| *G11C 11/4074* | (2006.01) |

(52) U.S. Cl.
CPC ............... *G11C 5/063* (2013.01); *G11C 5/14* (2013.01); *G11C 7/02* (2013.01); *G11C 7/1072* (2013.01); *G11C 11/4074* (2013.01)

(58) Field of Classification Search
CPC ........... G11C 5/14; G11C 8/02; G11C 7/1072; G11C 11/4074; G11C 5/063; H01R 12/53; H01R 13/6471

USPC ............ 365/191; 307/91; 361/816–818; 439/607–609

See application file for complete search history.

(56) References Cited

U.S. PATENT DOCUMENTS

| | | | |
|---|---|---|---|
| 8,851,908 B1 | 10/2014 | Leiba et al. | |
| 9,011,176 B2 * | 4/2015 | Tziviskos | ............ H05K 5/0247 439/607.4 |

(Continued)

FOREIGN PATENT DOCUMENTS

TW          200633183          9/2006

OTHER PUBLICATIONS

TIPO Office Action, Jun. 1, 2016, 5 pages.

*Primary Examiner* — Richard Elms
*Assistant Examiner* — Xiaochun L Chen
(74) *Attorney, Agent, or Firm* — Edell, Shapiro & Finnan, LLC

(57) ABSTRACT

A circuit structure for suppressing electromagnetic interference (EMI) of DDR SDRAM signals, applied to a memory interface unit (MIU) of a DDR SDRAM, includes: a first conducting line, coupled to a reference level; a second conducting line, parallel to the first conducting line, coupled to the reference level; a third conducting line, between and parallel to the first and second conducting lines, transmitting a signal, the first, second and third conducting lines located on a same plane; and a connecting component, having two ends, one of the two ends electrically connected to the first conducting line and the other of the two ends electrically connected to the second conducting line, the connecting component crossing and electrically insulated from the third conducting line.

11 Claims, 3 Drawing Sheets

(56) References Cited

U.S. PATENT DOCUMENTS

2008/0232186 A1* 9/2008 Yeh .................. G11C 7/02
 365/233.13
2009/0207538 A1   8/2009 Crawley et al.
2013/0329324 A1* 12/2013 Tziviskos ............ H05K 5/0247
 361/56

* cited by examiner

CIRCUIT STRUCTURE FOR SUPPRESSING ELECTROMAGNETIC INTERFERENCE OF DDR SDRAM SIGNALS

This application claims the benefit of Taiwan application Serial No. 104110472, filed Mar. 31, 2015, the subject matter of which is incorporated herein by reference.

BACKGROUND OF THE INVENTION

Field of the Invention

The invention relates in general to suppressing electromagnetic interference (EMI) of double data rate synchronous dynamic random access memory (DDR SDRAM) signals, and more particularly to a circuit structure for suppressing EMI of DDR SDRAM signals.

Description of the Related Art

Wires and lines routed on a circuit board are frequently one main factor causing electromagnetic interference (EMI). When EMI is caused by signal transmission of a memory interface unit (MIU) of a double data rate synchronous dynamic random access memory (DDR SDRAM), the performance of the DDR SDRAM is often degraded, e.g., reduced data transmission rate or increased data error rate. There are many signal limes in a partial circuit diagram of an MIU of a conventional DDR SDRAM. In an embodiment, a signal line is surrounded by ground lines at the two sides. In another embodiment, two signal lines are surrounded by two ground lines at the two sides. A signal line may be used for transmit a command signal, an address signal, a data signal DQ or a data strobe signal DQS for operating the DDR SDRAM. EMI is associated with the operating frequency of the DDR SDRAM and the length of a routing line. As the operating frequency of the DDR SDRAM gets higher, e.g., 200 MHz, a predetermined length of the routing line may cause noticeably high EMI under this frequency. Taking data actually measured for example, as the operating frequency of the DDR SDRAM is 200 MHz, the EMI may reach as high as 44 dB. Such high EMI exceeds the specification of DDR SDRAM, and likely results in data transmission errors or system instability. There are several conventional methods for reducing EMI.

In one of the methods, a capacitor is coupled between a signal line and a ground area. The main purpose of coupling this capacitor is to increase the rising time of the signal, such that the energy of EMI may be reduced. However, the tradeoff is that, the coupled capacitor reduces the quality of the signal, hence degrading the overall performance of the circuit. In another method, based on the principle of metal shielding effect, a metal shielding box or a metal film, e.g., copper foil, is covered on the circuit board. However, whether the metal shielding box or metal film is applied for covering, costs are increased.

SUMMARY OF THE INVENTION

The invention is directed to a circuit structure for suppressing electromagnetic interface (EMI) to reduce EMI by a low-cost method without degrading the performance of a circuit.

According to an embodiment of the present invention, a circuit structure applied to a memory interface unit (MIU) of a double data rate synchronous dynamic random access memory (DDR SDRAM) is provided. The circuit structure includes: a first conducting line, coupled to a reference level; a second conducting line, parallel to the first conducting line, coupled to the reference level; a third conducting line, between and parallel to the first conducting line and the second conducting line, transmitting a signal, the first conducting line, the second conducting line and third conducting line located on a same plane; and a connecting component, having two ends, one of the two ends electrically connected to the first conducting line and the other end electrically connected to the second conducting line, the connecting component crossing and electrically insulated from the third conducting line.

In the circuit structure for suppressing EMI of the present invention, by simply electrically connecting a fundamental passive electronic component, e.g., a resistor component, a capacitor component or an inductor component, to ground lines or ground areas at two sides of a signal line in a way that the passive electronic component crosses the signal line without coming into contact with the signal line, EMI can be effectively reduced. In one preferred embodiment, the electronic component may be a resistor component having an extremely low resistance value, e.g., a simple copper line, and the EMI generated by the signal line can be effectively reduced. Compared to the prior art, the electronic component used in the present invention is simple and low cost, and can be easily installed. Therefore, the present invention provides a more readily implemented and cost-effective method compared to the prior art.

The above and other aspects of the invention will become better understood with regard to the following detailed description of the preferred but non-limiting embodiments. The following description is made with reference to the accompanying drawings.

DETAILED DESCRIPTION OF THE INVENTION

Technical terms of the application are based on the general definition in the technical field of the application. If the application describes or explains one or some terms, definitions of the terms are based on the description or explanation of the application.

The present invention discloses a circuit structure for suppressing electromagnetic interference (EMI) capable of effectively suppressing EMI caused by circuit routing lines. The circuit structure is applicable to a memory interface unit (MIU) of a DDR SDRAM. In possible implementations, one skilled person in the art may choose equivalent elements or steps to implement the disclosure based on the disclosure of the application. That is, the implementation of the disclosure is not limited in the embodiments disclosed in the disclosure. Further, a part of the elements included in the circuit structure for suppressing EMI of the disclosure may be individually known elements. Without affecting the full disclosure and possible implementation of the device, details of the known elements are omitted.

Figure 1:
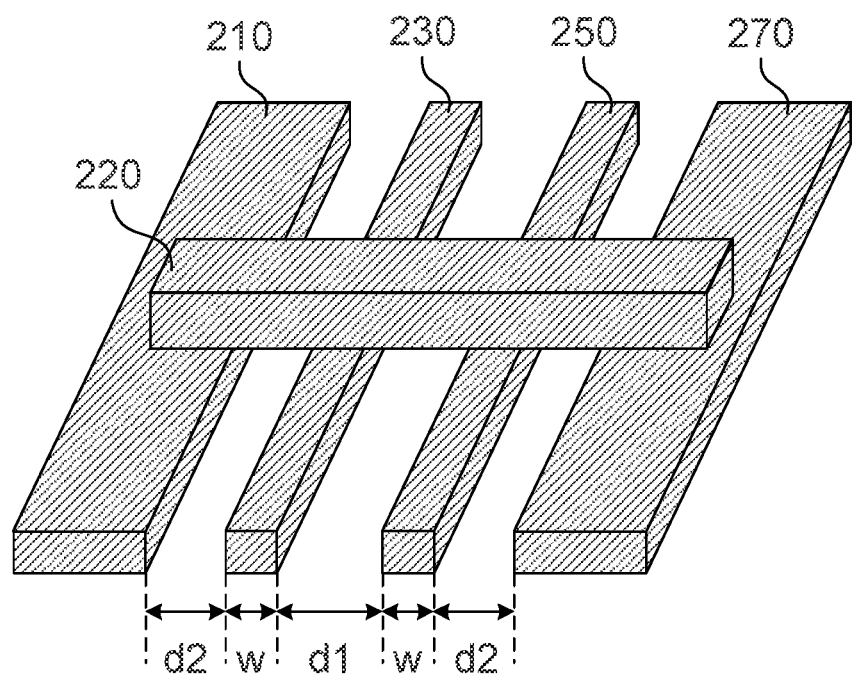
FIG. 1 is a schematic diagram of a circuit structure for suppressing electromagnetic interference (EMI) according to an embodiment of the present invention.

FIG. 1 shows a schematic diagram of a circuit structure for suppressing EMI according to an embodiment of the present invention. Referring to FIG. 1, the circuit structure includes a ground line 210, a signal line 230, a signal line 250, a ground line 270 and a connecting component 270. The ground line 210 and the ground line 270 are substantially parallel. The signal line 230 and the signal line 250 are between the ground line 210 and the ground line 270, and are substantially parallel to the ground line 210 and the ground line 270. The ground line 210, the signal line 230, the signal line 250 and the ground line 270 are located on the same plane. In one preferred embodiment, the circuit shown in FIG. 1 is a partial circuit of an MIU of a DDR SDRAM. The signal line 230 carries a command signal of the memory, e.g., a writing command or a reading command of the memory. The signal line 250 carries an address signal of the memory for indicating a memory address to be correspondingly accessed in response to the writing command or the reading command. As shown, the signal line 230 and the signal line 250 are surrounded by the ground line 210 and the ground line 270, a distance between the ground line 210 and the signal line 230 is d2, a width of the signal line 230 is w, a distance between the signal line 230 and the signal line 250 is d1, a width of the signal line 250 is w, and a distance between the signal line 250 and the ground line 270 is d2. The width w may be between 4 mil (1/1000 inch) and 6 mil, the distance d1 may be between 8 mil and 12 mil, and the distance d2 may be between 4 mil and 6 mil. The above values are examples for illustration purposes, and are not to be construed as limitations to the present invention. In one preferred embodiment, the width w may be 5 mil, the distance d1 may be 10 mil, and the distance d2 may be 5 mil.

As the signal line 230 or the signal line 250 is an equivalent antenna, crossing the equivalent antenna by a connecting component changes the radiation efficiency of the equivalent antenna, and two ends of the connecting component are preferably connected to the same voltage level, e.g., grounded. Thus, the connecting component 220 can be designed to cross above the signal line 230 and the signal line 250. The connecting component 220 has one end electrically connected to the ground line 210, the other end electrically connected to the ground line 270, and the middle part crossing above the signal line 230 and the signal line 250 without electrically connecting with the signal line 230 and the signal line 250. That is to say, the connecting component 220 is electrically insulated from the signal line 230 and the signal line 250. The connecting component 220 may be formed by a resistor component, preferably have a resistance value below 50Ω, and be made of one of copper and tin. In one preferred embodiment, the connecting component 220 may be a copper line having a resistance value equal to or approximately 0Ω, or other conducting lines having a resistance value equal to or approximately 0Ω. The parts of the connecting component 220 connected with the part of the ground line 210 and the part of the ground line 270 may be electrically connected by surface-mount technology (SMT). In the present invention, by connecting the ground lines 210 and 270 surrounding the signal lines 230 and 250 using the simple connecting component 220, the radiation efficiency of the equivalent antennas of the signal lines 230 and 250 may be effectively reduced to further suppress EMI. In an actual measurement result, before adding the connecting component 220, signals carried by the signal lines 230 and 250 generate about 44 dB EMI under a 200 MHz operating frequency. When this circuit structure is applied to a DDR SDRAM, such large EMI exceeds the range of the specification. However, after providing the connecting component 220 of the present invention, the EMI is reduced by about 54% to around 20 dB under the same operating frequency, thereby allowing the EMI to satisfy the requirement of the specification.

In another embodiment, the connecting component 220 may also be accomplished by a capacitor component or an inductor component. When applied to the above DDR SDRAM under the same operating frequency, the capacitance value of the capacitor component is preferably above 0.1 μF to achieve a better EMI suppression effect. For both the capacitor and the inductor component, the connecting component may be electrically connected to the ground lines 210 and 270 through SMT.

Figure 2:
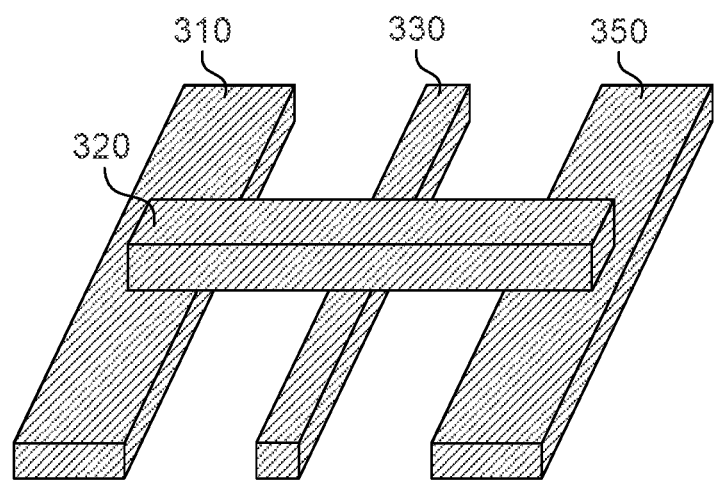
FIG. 2 is a schematic diagram of a circuit structure for suppressing EMI according to an embodiment of the present invention.

FIG. 2 shows a schematic diagram of a circuit structure for suppressing EMI according to another embodiment of the present invention. FIG. 2 similarly includes a ground line 310, a signal line 330, a ground line 350 and a connecting component 320. The ground line 310 and the ground line 350 are substantially parallel. The signal line 330 is between and substantially parallel to the ground line 310 and the ground line 350. The ground line 310, the signal line 330 and the ground line 350 are located on the same plane. In one preferred embodiment, the circuit in FIG. 2 shows a partial circuit of an MIU of a DDR SDRAM. The signal line 330 carries a command signal or an address signal of the memory. As shown, the signal line 330 is surrounded by the ground line 310 and the ground line 350. The connecting component 320 has one end electrically connected to the ground line 310, the other end electrically connected to the ground line 350, and the middle part crossing above the signal line 330 without electrically connecting with the signal line 330. That is to say, the connecting component 320 is electrically insulated from the signal line 330. The connecting component 320 may be formed by a resistor component, preferably have a resistance value below 50Ω, and be made of one of copper and tin. The connecting component 320 may also be a capacitor component or an inductor component. The part of the connecting component 320 connected with the ground line 310 and the part of the ground line 350 may be electrically connected by SMT. In the present invention, by connecting the ground lines 310 and 350 surrounding the signal line 330 using the simple connecting component 320, EMI can be effectively suppressed.

Figure 3:
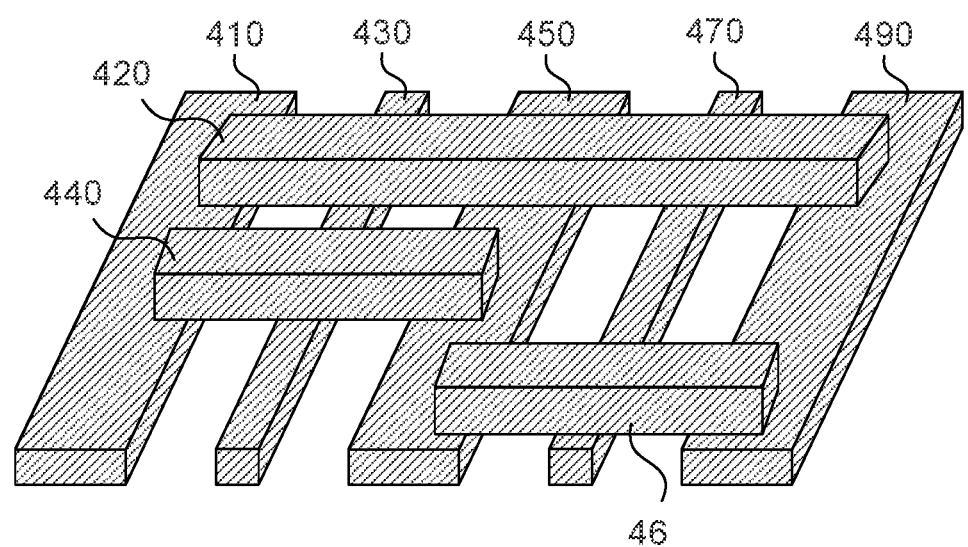
FIG. 3 is a schematic diagram of a circuit structure for suppressing EMI according to another embodiment of the present invention.

FIG. 3 shows a circuit structure for suppressing EMI according to another embodiment of the present invention. FIG. 3 includes a ground line 410, a signal line 430, a ground line 450, a signal line 470, a ground line 490, a connecting component 440 and a connecting component 460. The ground line 410, the ground line 450 and the ground line 490 are substantially parallel. The signal line 430 is between and substantially parallel to the ground line 410 and the ground line 450. The signal line 470 is between and substantially parallel to the ground line 450 and the ground line 490. The ground line 410, the signal line 430, the ground line 450, the signal line 470 and the ground line 490 are located on the same plane. In one preferred embodiment, the circuit in FIG. 3 is a partial circuit of an MIU of a DDR SDRAM. The signal line 430 and the signal line 470 carry command signals or address signals of the memory. The connecting component 420 has one end electrically connected to the ground line 410, the other end electrically connected to the ground line 490, and the middle part electrically connected or not electrically connected with the ground line 450 and crosses above the signal line 430 and the signal line 470 without electrically connecting with the two. That is to say, the connecting component 420 is electrically insulated from the signal line 430 and the signal line 470. The connecting component 440 has one end electrically connected to the ground line 410, the other end electrically connected to the ground line 450, and the middle part crossing above the signal line 430 without electrically connecting with the signal line 430. That is to say, the connecting component 440 is electrically insulated from the signal line 430. The connecting component 460 has one end electrically connected to the ground line 450, the other end electrically connected to the ground line 490, and the middle part crossing above the signal line 470 without electrically connecting with the signal line 470. That is to say, the connecting component 460 is electrically insulated from the signal line 470. Similar to the connecting components 220 and 320, the connecting components 420, 440 and 460 may be formed by resistor components and be made of one of copper and tin, or be formed by capacitor components or inductor components. The parts of connecting component 420, the connecting component 440 and the connecting component 460 connected with the parts of the ground line 410, the ground line 450 and the ground line 490 may be performed by SMT. As shown, in the present invention, the connecting component for suppressing EMI may cross not only the signal lines but also other ground lines. Further, any two of the three ground lines may be crossed and connected by other connecting components, thereby further effectively suppressing EMI.

In conclusion, by using the characteristic of a signal line being an equivalent antenna and simply crossing a passive electronic component coupled to a fixed level above the signal line, the present invention reduces the radiation efficiency of the equivalent antenna to effectively suppress EMI. The present invention is advantaged by being low-cost and having simple implementation. It should be noted that, the shapes, sizes, ratios and sequences of the steps in the drawings are examples for explaining the present invention to one person skilled in the art, not limiting the present invention. In possible implementation, one skilled person in the art would selectively implement part or all technical features of any embodiment of the application or selectively combine part or all technical features of the embodiments of the application based on the disclosure of the present invention to enhance the implementation flexibility of the present invention. Further, an MIU of a DDR SDRAM is used as an example in the embodiments, and is not to be construed as a limitation to the present invention. One person skilled in the art may appropriately apply the present invention to routing lines of other electronic devices.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A circuit structure, applied to a memory interface unit (MIU) of a double data rate synchronous dynamic random access memory (DDR SDRAM), comprising:,
    a first conducting line, coupled to a reference level;
    a second conducting line, parallel to the first conducting line, coupled to the reference level;
    a third conducting line, between the first conducting line and the second conducting line and parallel to the first conducting line and the second conducting line, transmitting a signal, the first conducting line, the second conducting and the third conducting located on a same plane;
    a connecting component, having two ends, one of the two ends electrically connected to the first conducting line and the other of the two ends electrically connected to the second conducting line, the connecting component crossing the third conducting line and electrically insulated from the third conducting line;
    the signal is a first signal, the circuit structure further comprising:
    a fourth conducting line, between the first conducting line and the second conducting line and parallel to the first conducting line and the second conducting line, transmitting a second signal;
    wherein, the fourth conducting is located on the same plane as the first conducting line, the second conducting line and the third conducting line, and the connecting component crosses the fourth conducting line and is electrically insulated from the fourth conducting line;
    a fifth conducting line, between the third conducting line and the fourth conducting line and parallel to the first conducting line and the second conducting line, coupled to the reference level;
    wherein, the fifth conducting line is located on the same plane as the first conducting line, the second conducting line, the third conducting line and the fourth conducting line;
    the connecting component is a first connecting component, the circuit structure further comprising:
    a second connecting component, having two ends, one of the two ends electrically connected to the fifth conducting line and the other of the two ends electrically connected to one of the first conducting line and the second conducting line, and crosses and is electrically insulated from one of the third conducting line and the fourth conducting line;
    wherein the first connecting component and the second connecting component are selected from a group consisting of a resistor component, a capacitor component and an inductor component.

2. The circuit structure according to claim 1, wherein the signal is for accessing one of a command signal and an address signal of the DDR SDRAM.

3. The circuit structure according to claim 1, wherein the first signal is for accessing one of a command signal and an address signal of the DDR SDRAM, and the second signal is one of the command signal and the address signal.

4. The circuit structure according to claim 1, wherein a first space between the first conducting line and the third conducting line is equal to a second space between the second conducting line and the fourth conducting line.

5. The circuit structure according to claim 4, wherein the first space is between 4 mil and 6 mil.

6. The circuit structure according to claim 5, wherein a third space between the third conducting line and the fourth conducting line is between 8 mil and 12 mil.

7. The circuit structure according to claim 1, wherein the connecting component crosses the fifth conducting line and is electrically insulated from the fifth conducting line.

8. The circuit structure according to claim 1, wherein the connecting component is further electrically connected to the fifth conducting line.

9. The circuit structure according to claim 1, wherein a resistance value of the resistor component is smaller than 50Ω.

10. The circuit structure according to claim 1, wherein the second connecting component is a conducting line.

11. The circuit structure according to claim 1, wherein the connecting component is a conducting line.

* * * * *